US006498925B1

(12) United States Patent
Tauchi

(10) Patent No.: US 6,498,925 B1
(45) Date of Patent: Dec. 24, 2002

(54) TRANSMIT POWER CONTROL CIRCUIT

(75) Inventor: Nobutaka Tauchi, Toyoake (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/561,781

(22) Filed: May 1, 2000

(30) Foreign Application Priority Data

May 13, 1999 (JP) .......................................... 11-133165

(51) Int. Cl.[7] .......................... H03C 1/62; H04B 17/00
(52) U.S. Cl. ...................................... 455/115; 455/126
(58) Field of Search ............................... 455/126, 127, 455/115, 78; 330/124 R, 195

(56) References Cited

U.S. PATENT DOCUMENTS

| | | | | |
|---|---|---|---|---|
| 5,023,937 A | * | 6/1991 | Opas | 455/126 |
| 5,196,806 A | * | 3/1993 | Ichihara | 330/137 |
| 5,530,923 A | * | 6/1996 | Heinonen et al. | 455/126 |
| 5,697,074 A | * | 12/1997 | Makikallio et al. | 455/126 |
| 6,038,432 A | * | 3/2000 | Onoda | 455/127 |
| 6,108,527 A | * | 8/2000 | Urban et al. | 455/115 |
| 6,151,509 A | * | 11/2000 | Chorey | 455/550 |
| 6,178,309 B1 | * | 1/2001 | Mizoguchi | 455/67.1 |
| 6,215,987 B1 | * | 4/2001 | Fujita | 455/127 |
| 6,288,606 B1 | * | 9/2001 | Ekman et al. | 330/51 |
| 6,301,486 B1 | * | 10/2001 | Tanaka | 455/522 |

FOREIGN PATENT DOCUMENTS

JP          10-150429          2/1998

* cited by examiner

Primary Examiner—Daniel Hunter
Assistant Examiner—Tuan Tran
(74) Attorney, Agent, or Firm—Harness, Dickey & Pierce, PLC

(57) ABSTRACT

A transmit power control circuit, which can control a transmit power of a transmit power control circuit through wide dynamic range and can reduce an insertion loss. A first attenuator inputs a radio-frequency signal and outputs an output signal after controlling the inputted radio-frequency signal. A selective switch inputs the output signal of the first attenuator, and outputs it to one of a main transmission line and an auxiliary transmission line. One directional coupler is provided to the main transmission line and has one and another ends respectively connected to selective switches. The selective switches are switched by a signal from a microcomputer. When the selective switch is switched to the main transmission line, one end of the directional coupler is connected to a terminator, and another end thereof is connected to a wave detector. On the contrary, when the selective switch is switched to the auxiliary transmission line, one end of the directional coupler is connected to the auxiliary transmission line, and another end thereof is connected to a terminator.

8 Claims, 7 Drawing Sheets

TRANSMIT POWER CONTROL CIRCUIT

CROSS REFERENCE TO RELATED APPLICATION

This application is based upon Japanese Patent Application No. Hei. 11-133165 filed on May 13, 1999, the contents of which are incorporated herein by reference.

BACKGROUND OF THE INVENTION

1. Field of the Invention

This invention relates to transmit power control circuits, and particular to a transmit power control circuit suitable for a radio communication apparatus.

2. Related Art

Recently, transmit power (power level of transmit output signal) is controlled in a radio communication apparatus such as a portable telephone.

FIG. 5A shows a schematic block diagram of a transmit power control circuit according to a related art. The transmit power control circuit is basically provided with an attenuator 51 and a power amplifier 52. The attenuator 51 inputs a radio-frequency signal (RF signal) as an input signal, attenuates the input signal by attenuation depending on a control voltage from a control device such as a not-shown microcomputer, and outputs the attenuated signal as an output signal. The power amplifier 52 amplifies the output signal of the attenuator 51 with a predetermined gain, and supplies the amplified signal to an antenna as a transmit output signal. According to this transmit power control circuit, the transmit power of the transmit output signal can be controlled by changing the attenuation of the attenuator 21, as shown in FIG. 5B.

Furthermore, when the transmit power is detected to control the transmit power, as shown in FIG. 5A, a directional coupler 53 is provided at later stage of the power amplifier 52. One end of the directional coupler 53 is connected to a terminator 54, and another end is connected to a wave detector 55, so that voltage in proportion to the transmit power is measured by detecting the power by using the wave detector 55.

However, in the transmit power control circuit described in the above, since a dynamic range of the attenuation of the attenuator has a limitation, it is difficult to control the transmit power through wide range. Particularly, in a case where the CDMA (Code Division Multiple Access) method is applied to the radio communication apparatus such as the portable telephone, since the radio communication apparatus needs to control own transmit power through wide dynamic range based on a command from a base station, it is difficult to apply the above-described transmit power control circuit to the radio communication apparatus using the CDMA method.

SUMMARY OF THE INVENTION

This invention has been conceived in view of the background thus far described and its first object is to control a transmit power of a transmit power control circuit through wide dynamic range.

Its second object is to control a transmit power of a transmit power control circuit through wide dynamic range and to reduce an insertion loss.

According to the present invention, when the output signal of the variable gain circuit is outputted to the main transmission line, one end of the directional coupler is connected to a first terminator, and another end of the directional coupler is connected to a wave detector. On the contrary, when the output signal of the variable gain circuit is outputted to the auxiliary transmission line, the one end of the directional coupler is connected to the auxiliary transmission line, and said another end of the directional coupler is connected to a second terminator.

According to the above structure, a transmit power can be controlled through wide dynamic range by switching between the main transmission line and the auxiliary transmission line. Furthermore, since the directional coupler is used both for detecting the transmit power using the wave detector and for controlling the transmit power using the auxiliary transmission line, by selecting one of them, an insertion loss can be reduced.

According to another aspect of the present invention, a first switching circuit selects one of a main transmission line (A) and an auxiliary transmission line (B). An amplifying circuit, provided to the main transmission line, amplifies the output signal of the variable gain circuit, which is outputted to the main transmission line. A one end of a directional coupler is electrically connected to an auxiliary transmission line, and another end of the directional coupler is electrically connected to a terminator.

According to the above structure, a transmit power can be controlled through wide dynamic range by switching between the main transmission line and the auxiliary transmission line.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

Figure 1:
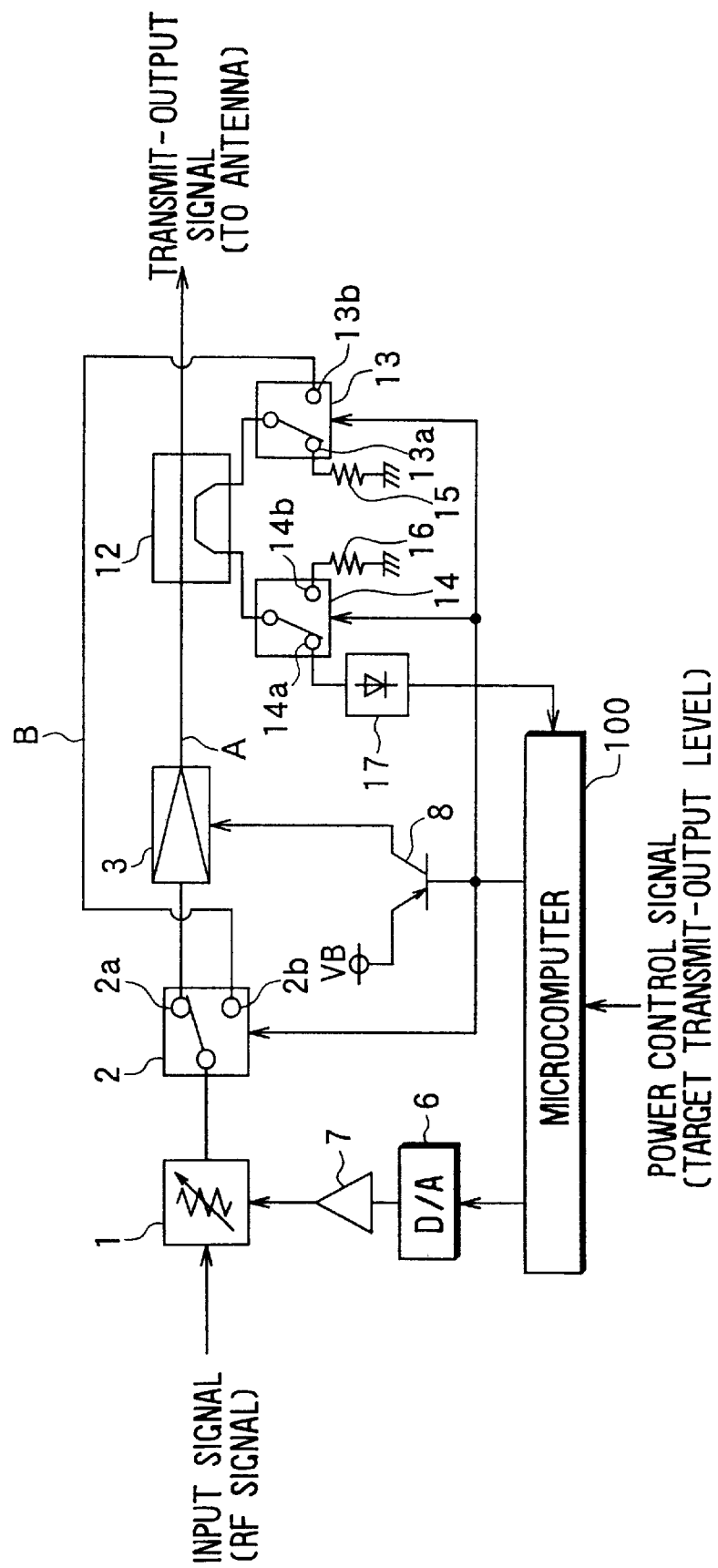
FIG. 1 is a schematic block diagram of a transmit power control circuit of a first embodiment according to the present invention.
Figure 2:
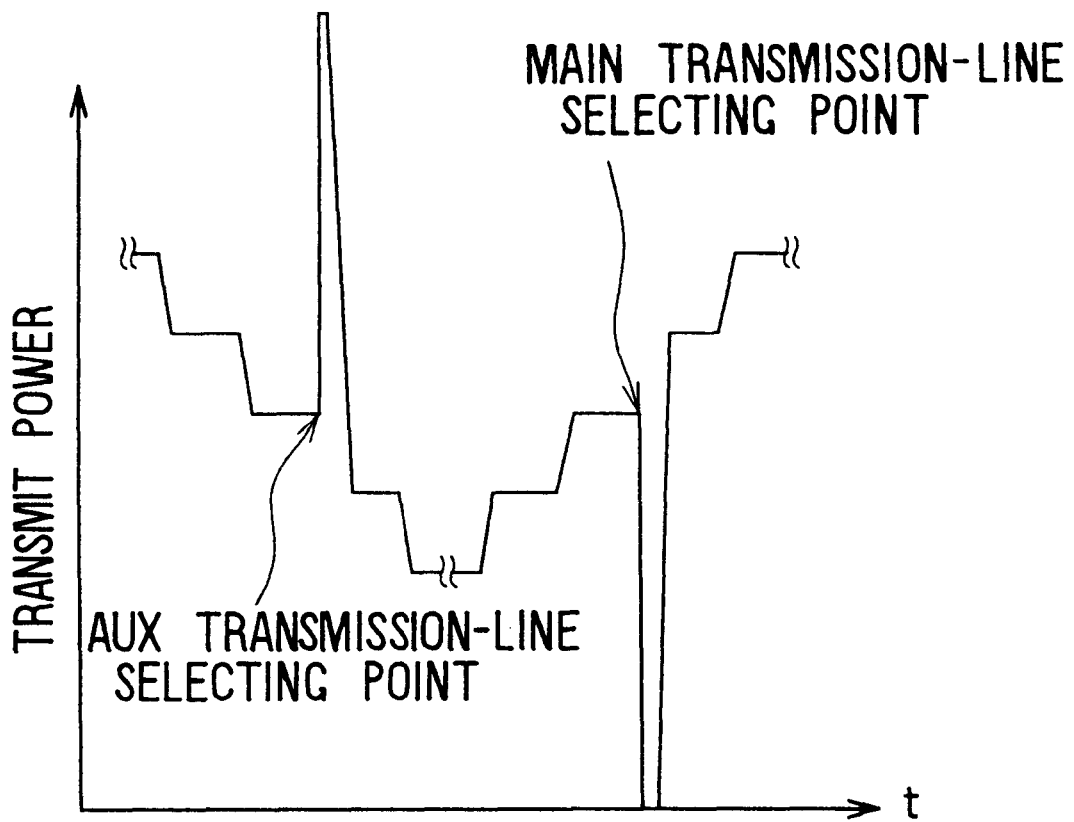
FIG. 2 is a diagram illustrating a characteristic of the transmit power control circuit shown in FIG. 1.

DESCRIPTION OF THE PREFERRED EMBODIMENTS (Related work)

At first, a transmit power control circuit, which can control a transmit power through wide dynamic range, according to a related work will be explained with reference to FIG. 6. This transmit power control circuit is disclosed in not-known Japanese patent application, application serial No. Hei. 10-269830 filed on Sep. 24, 1998, and the contents of which are incorporated herein by reference.

The transmit power control circuit is provided with an attenuator 1 as a variable gain circuit, a selective switch (radio-frequency switch) 2 as a switching circuit, a power amplifier 3, a main transmission line A, an auxiliary transmission line (bypass line) B, a directional coupler 4 and a terminator 5. The attenuator 1 inputs a modulated radio-frequency signal as an input signal, and attenuates the inputted signal with an attenuation, which changes in accordance with a control voltage as a control signal (in other word, the attenuator 1 amplifies the inputted signal with a negative gain, which changes in accordance with a control voltage as a control signal). The selective switch 2 selects one of a first output terminal 2a and a second output terminal 2b based on a switching signal, and outputs an output signal of the attenuator 1 from one of the first output terminal 2a and the second output terminal 2b. The power amplifier 3 amplifies a signal outputted from the first output terminal 2a with a predetermined positive gain GA. The main transmission line A transmits an amplified output signal of the power amplifier 3 to an antenna as a transmit output signal. One end of the auxiliary transmission line B is connected to the second output terminal 2b of the selective switch 2, and another end of the same is connected to one end of the directional coupler 4. Another end of the directional coupler 4 is connected to the terminator 5. The directional coupler 4 couples with the main transmission line A with a predetermined amount of coupling, so that a signal outputted from the second output terminal 2b of the selective switch 2 is attenuated with the predetermined amount of coupling, and that the attenuated signal is transmitted to the antenna through the main transmission line A as the transmit output signal.

The directional coupler 4 couples at a side of the terminator 5 with respect to a transmission of the signal toward the antenna in the main transmission line A, and couples to the antenna direction of the main transmission line A with respect to the transmission of the signal toward the terminator 5 in the auxiliary transmission line B.

Here, a minimum value of the attenuation ATT of the attenuator 1 (that is, a maximum value Gmax of the gain) is 0 dB. The dynamic range of the attenuation ATT is set to equal to or more than a particular value, which is a sum of a gain GA of the power amplifier 3 and the amount of coupling CD of the directional coupler 4 (=GA+CD).

Here, the transmit power control circuit is further provided with a microcomputer 100, a D/A converter 6, an operational amplifier 7, and a power supply transistor 8. The microcomputer 100 outputs an attenuation control data for adjusting the attenuation ATT of the attenuator 1 based on a power control signal, which indicates a target transmit output level, sent from a base station; and the microcomputer 100 further outputs the switching signal for operating the selective switch 2. The D/A converter 6 converts the attenuation control data into an analog signal. The operational amplifier 7 amplifies the analog signal from the D/A converter 6, and outputs the amplified signal to the attenuator 1 as the control voltage. The power supply transistor 8 supplies a voltage VB of a battery, which is assembled in the portable telephone, to the power amplifier 3 as an operation power supply (bias power supply).

Here, in a case where the switching signal from the microcomputer 100 is a logically low level, the selective switch 2 outputs the output signal of the attenuator 1 to the main transmission line A via the first output terminal 2a. As a result, the power supply transistor 8 is turned on, and the operation power supply is supplied from the battery to the power amplifier 3. On the contrary, in a case where the switching signal from the microcomputer 100 is a logically high level, the selective switch 2 outputs the output signal of the attenuator 1 to the auxiliary transmission line B via the second output terminal 2b. As a result, the power supply transistor 8 is turned off, and the operation power supply is cut off.

According to this structure, when the selective switch 2 is connected to the first output terminal 2a, a signal, which is the input signal attenuated with the attenuation ATT of the attenuator 1, is amplified in proportion to the gain GA of the power amplifier 3, and the amplified signal is supplied to the antenna as the transmit output signal. On the contrary, when the selective switch 2 is connected to the second output terminal 2b, the signal, which is the input signal attenuated with the attenuation ATT of the attenuator 1, is supplied to the auxiliary transmission line B without passing through the power amplifier 3, and the supplied signal is further supplied to the antenna as the transmit output signal via the main auxiliary transmission line A by the directional coupler 4.

Figure 7:
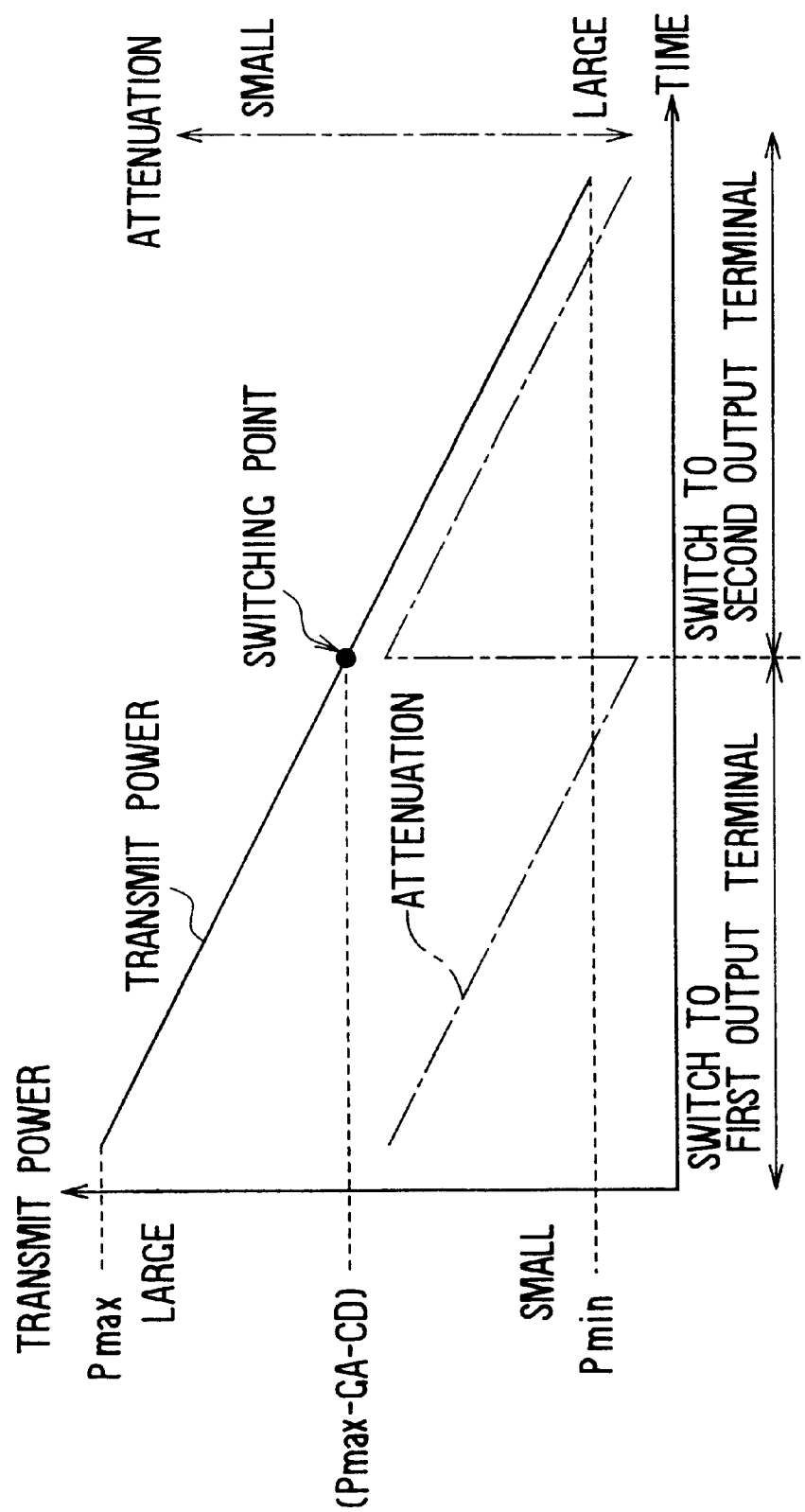
FIG. 7 is a diagram illustrating a characteristic of the transmit power control circuit shown in FIG. 6.

As shown in FIG. 7, when the attenuation ATT of the attenuator 1 is set to a minimum while the selective switch 2 is connected to the first output terminal 2, the transmit power (that is, a power level of the transmit signal supplied from the main transmission line A to the antenna) becomes a maximum level Pmax. On the contrary, when the attenuation ATT of the attenuator 1 is set to a maximum while the selective switch 2 is connected to the second output terminal 2b, a total gain of the transmit power control circuit becomes minimum, and the transmit power becomes a minimum level Pmin.

When the transmit power is changed from the maximum level Pmax to a particular level (=Pmax−GA−CD), which is an attenuated maximum level attenuated by the sum of the gain GA of the amplifier 3 and the amount of coupling CD of the directional coupler 4, as shown by a right side of a mark "●", the attenuation ATT is changed with connecting the selective switch 2 to the first output terminal 2a. In this case, the transmit power is changed in proportion to the attenuation ATT of the attenuator 1.

In a case where the attenuation ATT of the attenuator 1 is equal to the sum of the gain GA of the power amplifier 3 and the amount of coupling CD of the direction coupler 4 (in other words, when the gain of the attenuator 1 is reduced from the maximum gain Gmax (=0 dB) to a particular value, which is lower than the Gmax by the sum of the gain GA and the amount of coupling CD), the transmit power becomes Pmax−GA−CD. When the attenuation ATT is reduced from this condition, as shown by a left side of the mark "●", the transmit power Pmax can rise to the maximum level Pmax.

The operation described in the above will be described in detail by using specific values. For example, it assumes that the power level of the input signal inputted to the attenuator 1 is −10 dBm, the dynamic range of the attenuation ATT of the attenuator 1 is 0 dB–35 dB (in other words, the maximum gain Gmax is 0 dB, and the minimum gain Gmin is −35 dB), the gain GA of the amplifier 3 is 30 dB, and the amount of coupling CD of the directional coupler 4 is 5 dB. In this case, the maximum level Pmax of the transmit power is 20 dBm (=−10 dBm−0 dB+30 dB), and the minimum level Pmin is −50 dBm (=−10 dBm−35 dB−5 dB).

When the transmit power is changed from 20 dBm as the maximum level Pmax to −14 dBm (=Pmax−GA−CD−1 dB=20 dBm −30 dB −5 dB −1 dB), the attenuation ATT of the attenuator 1 is changed with selecting the selective switch 2 to the first output terminal 2a. When the attenuation ATT becomes 35 dB (=GA+CD=30 dB+5 dB), the transmit power becomes −15 dBm. When it needs to further reduce the transmit power, the selective switch is switched to the second output terminal 2b, the attenuation ATT is returned to 0 dB as the minimum value, and the attenuation ATT is changed in this condition. As a result, the transmit power can be changed from −15 dBm to −50 dBm as the minimum level Pmin.

On the contrary, when the transmit power is changed from −50 to −15 dBm, the attenuation ATT of the attenuator 1 is changed with selecting the selective switch 2 to the second output terminal 2b. When the attenuation ATT becomes 0 dB as the minimum value, the transmit power becomes −15 dBm. When it needs to further reduce the transmit power, the selective switch is switched to the first output terminal 2a, the attenuation ATT is set to 34 dB (=GA+CD−1 dB=30 dBm+5 dB−1 dB). As a result, the transmit power can be changed from −14 dBm to 20 dBm as the maximum level Pmax, when the attenuation ATT is changed in this condition.

The microcomputer 100 controls so that the transmit power accords with the target transmit output level, which indicates the power control signal from the base station. Therefore, when the microcomputer 100 compares the present transmit power and the target transmit output level, and determines that it needs to lower the transmit power, the microcomputer 100 increases the attenuation ATT of the attenuator 1 ΔA by ΔA (for example, ΔA=1 dB). When the attenuation ATT reaches 5 dB (=GA+CD), the selective switch 2 is switched to the second output terminal 2b, and returns the attenuation ATT to 0 dB as the minimum value. After that, the microcomputer 100 increases the attenuation ATT from this condition ΔA by ΔA. On the contrary, when the microcomputer 100 determines that it needs to heighten the transmit power, the microcomputer 100 decreases the attenuation ATT of the attenuator 1 ΔA by ΔA. When the attenuation ATT reaches 0 dB as the minimum value, the selective switch 2 is switched to the first terminal 2a, and returns the attenuation ATT to 5 dB. After that, the microcomputer 100 decreases the attenuation ATT from this condition ΔA by ΔA.

The above structure can control a transmit power of a transmit power control circuit through wide dynamic range.

Figure 6:
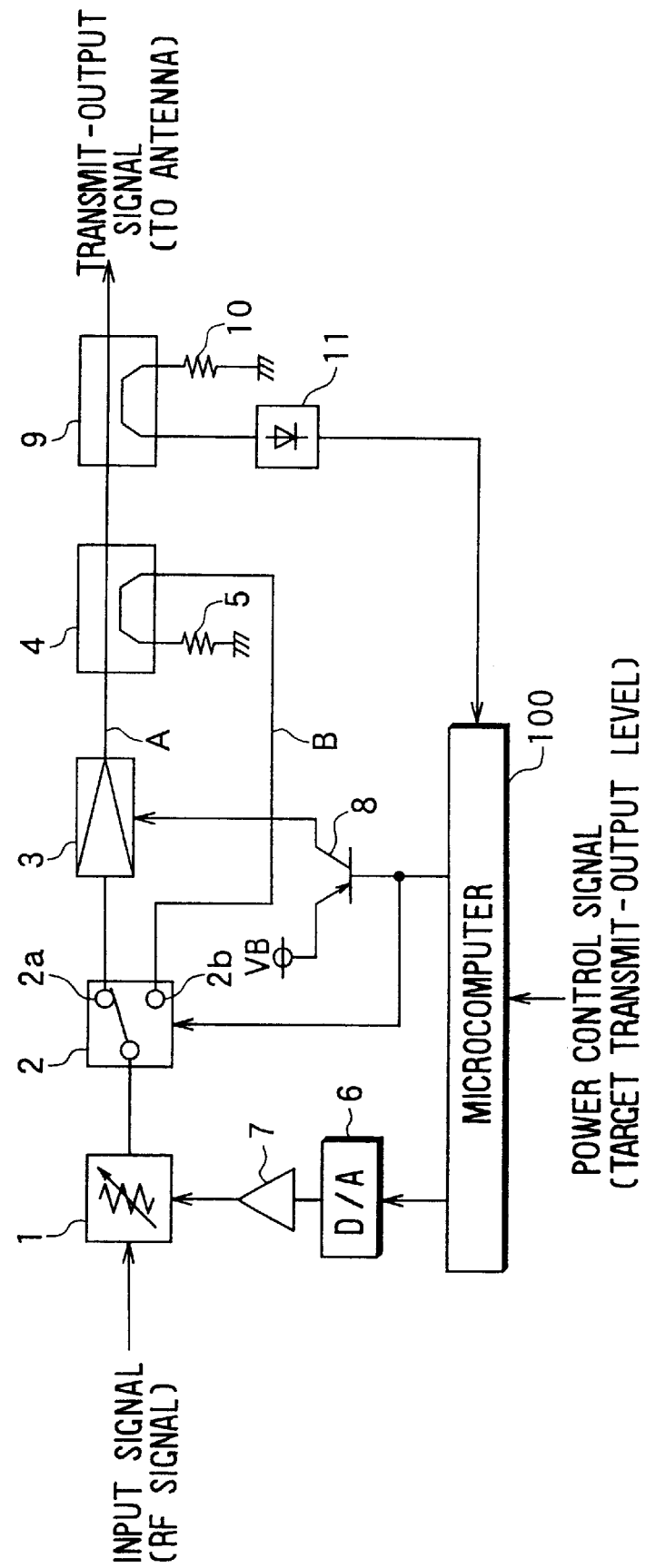
FIG. 6 is a schematic block diagram of a transmit power control circuit of a first embodiment according to a not-known related work.

Furthermore, according to the transmit power control circuit in the above, as shown in FIG. 6, when the selective switch 2 is switched to the second output terminal 2b, the power supply transistor 8 is turned off, so that the power supply to the power amplifier 3 is cut off. As a result, the transmit power control circuit 3 can reduce power consumption. Furthermore, even if the radio-frequency signal leaks to former stage of the power amplifier 3, since the leaked signal is never amplified by the power amplifier 3, the microcomputer 100 can control the transmit power with a excellent linearity.

When the transmit power is detected to control the transmit power, it could be thought that a directional coupler 9 is provided at later stage of the directional coupler 9, so that one end is connected to the terminator 10 and another end is connected to the wave detector 11, as shown in FIG. 6.

Here, the detector 11 is constructed by a wave detection diode. The wave detection diode generally saturates when a range of input power is 30–40 dB. Therefore, when the transmit power is controlled through wide dynamic range over 70 dB, it would be difficult to obtain a dynamic range in accordance with the power range. Furthermore, it might be thought that an amount of coupling of the directional coupler 9 is increased in order to obtain wide power wave detection range; however, an insertion loss of the transmit power might increase in this case. Moreover, since two directional couplers are provided, the insertion loss might increase.

(First embodiment)

FIG. 1 shows a schematic block diagram of a transmit power control circuit of a first embodiment. In the drawings, same portions or corresponding portions as those in FIG. 6 are put the same numerals each other to eliminate redundant explanation.

In this embodiment, a direction coupler 12 is provided at latter stage of the power amplifier 3. One end of the direction coupler 12 is connected to a selective switch 13, and another end is connected to a selective switch 14. A first output terminal 13a of the selective switch 13 is connected to a terminator 15, and a second output terminal 13b is connected to the auxiliary transmission line B. A first output terminal 14a of the selective switch 14 is connected to a wave detector (wave detection diode) 17, and a second output terminal 14b is connected to a terminator 16.

The microcomputer 100 performs the substantially the same control as those of FIG. 6. In detail, the microcomputer 100 switches the switches 13 and 14 simultaneously with the switching of the selective switch 2. When the microcomputer 100 outputs the switching signal having a logically low level, the selective switches 2, 13 and 14 are respectively switched to the first output terminals 2a, 13a and 14a. On the contrary, when the microcomputer 100 outputs the switching signal having a logically high level, the selective switches 2, 13 and 14 are respectively switched to the second output terminals 2b, 13b and 14b.

Here, when the selective switches 2, 13 and 14 are switched to the first output terminals 2a, 13a and 14a, the one end of the directional coupler 12 is connected to the terminator 13 and another end is connected to the wave detector 17. In this situation, similar to FIG. 6, the transmit power is controlled at the felt side of mark "●" that is a range whose transmit power is relatively large. In this case, the microcomputer 100 controls the transmit power based on a detected output (detected voltage) from the wave detector 17.

On the contrary, when the selective switches 2, 13 and 14 are switched to the second output terminals 2b, 13b and 14b, the one end of the directional coupler 12 is connected to the auxiliary transmission line B and another end is connected to the terminator 16. In this situation, similar to FIG. 6, the transmit power is controlled at the right side of mark "●", that is a range whose transmit power is relatively small. In this case, since the microcomputer 100 cannot detect the transmit power by using the wave detector 17, the microcomputer 100 controls the transmit power without using the output signal from the wave detector 17. In the radio communication using the CDMA method, an absolute transmit power accuracy range is wide and an absolute transmit power level accuracy is not required within a small transmit power range, it is no problem if the microcomputer 100 controls the transmit power without using the output signal from the wave detector 17.

According to this embodiment, one directional coupler 12 is used, and the transmit power is detected by using the wave detector 17 so that the transmit power is accurately controlled within a large transmit power range, and the transmit power is controlled by using the auxiliary transmission line B within a small transmit power range. As a result, since the transmit power control circuit does not use two directional couplers 4 and 9 as the transmit power control circuit shown in FIG. 6, the insertion loss can be reduced.

(Second embodiment)

According to the first embodiment, similar to the transmit power control circuit shown in FIG. 6, the attenuation of the attenuator 1 is switched at a timing when the selective switch 2 is switched to one of the first and second output terminal 2a or 2b.

In a wideband CDMA method, the transmit power control circuit performs a communication with a transmit data having a frame structure made up of a pilot symbol and data. When the transmit power overshoots or undershoots, since the transmit power widely varies, the transmit power control circuit might not accurately send the transmit data to the base station. In this case, since the transmit power control circuit using the wideband CDMA method synchronously communicates with the base station by using the pilot symbol, the transmit power control circuit might not accurately synchronously communicates with the base station when the pilot symbol is not adequately outputted. Furthermore, when the transmit power overshoots, the transmit power instantaneously rises. In such a case, the transmit power may be disturb radio wave for the base station.

Figure 3:
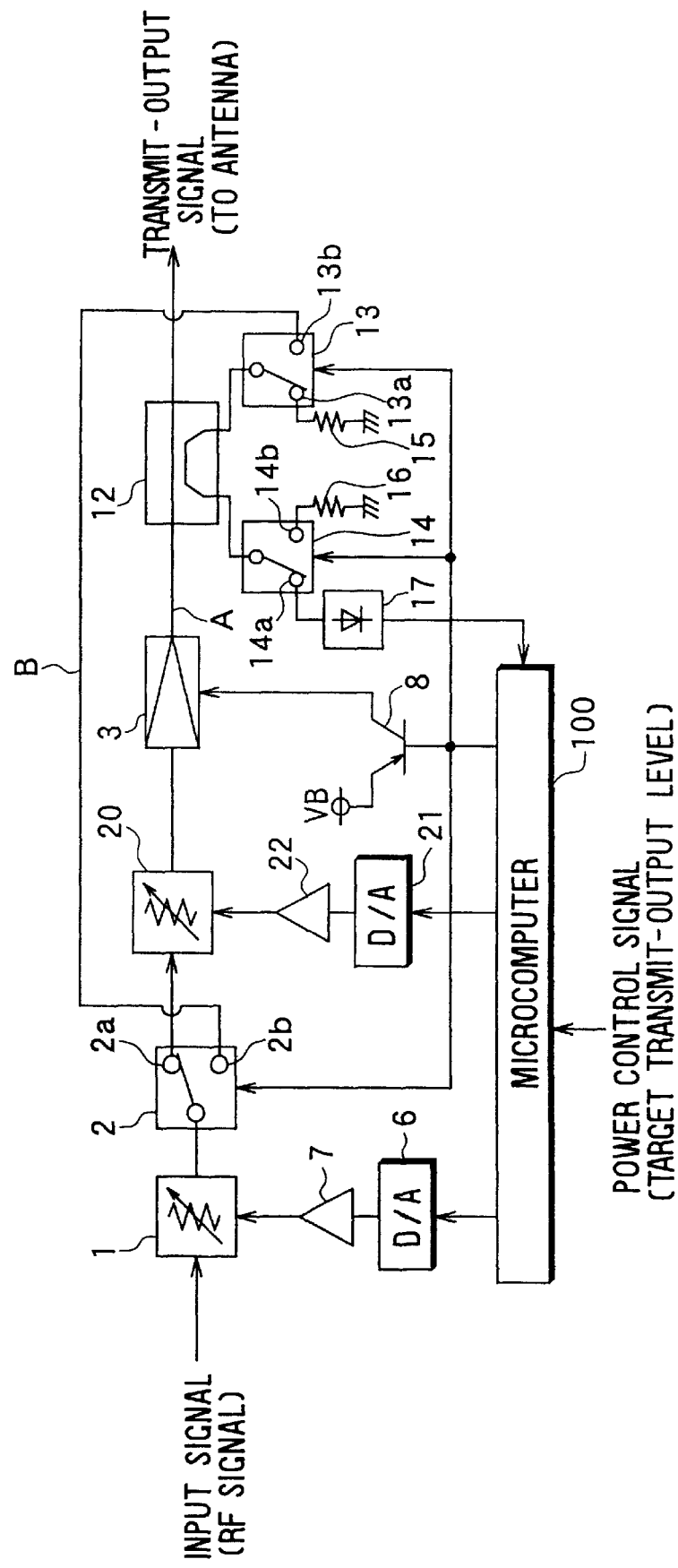
FIG. 3 is a schematic block diagram of a transmit power control circuit of a second embodiment according to the present invention.

In this third embodiment, as shown in FIG. 3, a second attenuator 20 is provided between the first output terminal 2a of the selective switch 2 and the power amplifier 3, in addition to the attenuator 1 (in this embodiment, called as a first attenuator 1) which is provided at former stage of the selective switch 2. According to this structure, an attenuation of the second attenuator 20 is determined based on a control voltage, which is inputted from the microcomputer 100 via the D/A converter 21 and is amplified by the operational amplifier 22.

The microcomputer 100 of this embodiment controls the transmit power as follows.

When the microcomputer 100 decreases the transmit power from the maximum level, the selective switch 2 is switched to the first output terminal 2a, so that the maximum value of an attenuation ATT1 of the first attenuator 1 is set to 0 dB. After that, the microcomputer 100 controls an attenuation ATT2 of the second attenuation 20 from the minimum value, 0 dB. As a result, the transmit power changes in accordance with the attenuation ATT2 of the second attenuator 20.

When the attenuation ATT2 of the second attenuator 20 reaches a sum of the gain GA of the power amplifier 3 and the amount of the coupler CD-1 of the directional coupler 34, the transmit power becomes Pmax-GA-CD-1. However, when the transmit power is further decreased, the selective switch 2 is switched to the second output terminal 2b, and the attenuation ATT2 of the second attenuator 20 is kept to constant. In this situation, the microcomputer 100 controls so that the attenuation ATT1 of the first attenuator 1 becomes large. As a result, the transmit power can be further reduced to the minimum level in accordance with the attenuation ATT1 of the first attenuator 1.

On the contrary, while the selective switch 2 is switched to the second output terminal 2b, when the transmit power is increased from the minimum level, the microcomputer 100 controls so that the attenuation ATT1 of the first attenuator 1 becomes small. When the attenuation ATT1 of the first attenuator 1 reaches the minimum value, 0 dB, the selective switch 2 is switched to the first output terminal 2a, and the attenuation ATT1 of the first attenuator 1 is kept to constant. In this situation, the microcomputer 100 controls so that the attenuation ATT2 of the second attenuator 20 becomes large.

According to this structure, the transmit power can be continuously changed between the maximum level and the minimum level. Furthermore, since the microcomputer 100 moves to a gain control by using one of the first and second attenuators 1 and 20, which has not been controlled until that time, with remaining the gain of another of the first and second attenuators 1 and 20, the microcomputer 100 can prevent the overshoot or the undershoot of the transmit power.

(Third embodiment)

Figure 4:
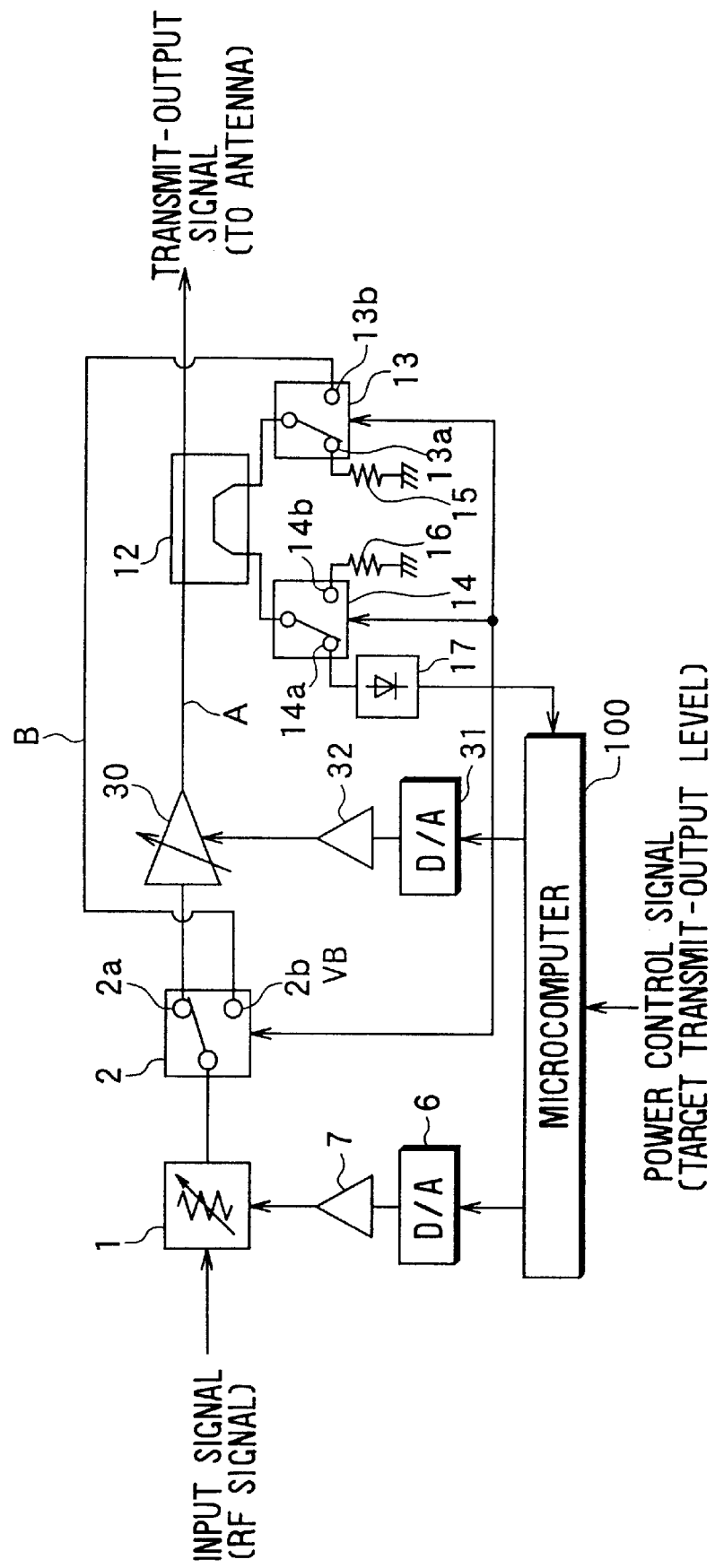
FIG. 4 is a schematic block diagram of a transmit power control circuit of a third embodiment according to the present invention.
Figure 5A:
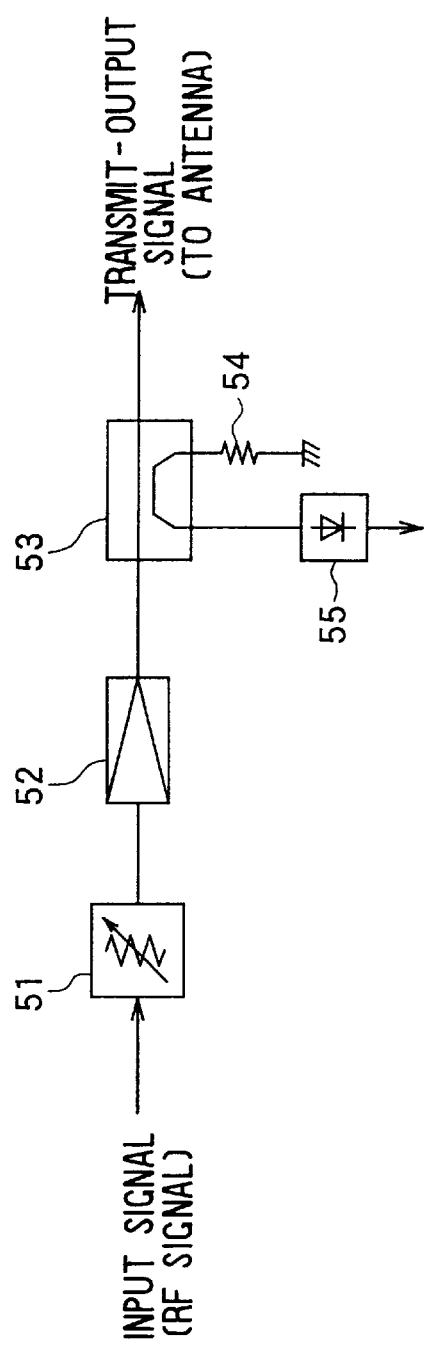
FIG. 5A is a schematic block diagram of a transmit power control circuit according to a related art.
Figure 5B:
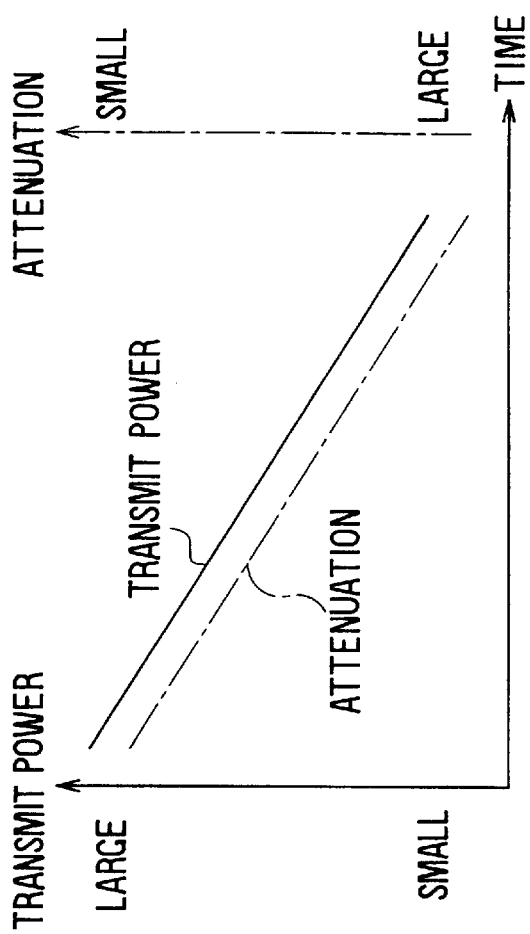
FIG. 5B is a diagram illustrating a characteristic of the transmit power control circuit shown in FIG. 5A.

In the second embodiment, the second attenuator 20 and the power amplifier 3 are applied. However, in a third embodiment, as shown in FIG. 4, a variable gain power amplifier 30, which amplifies by a positive gain based on the control signal as the input signal, may be used instead. In this case, the gain of the variable gain power amplifier 30 is controlled by the control voltage, which is inputted from the microcomputer 100 via the D/A converter 31 and is amplified by the operational amplifier 32.

The microcomputer 100 of this embodiment controls the transmit power as follows.

When the microcomputer 100 decreases the transmit power from the maximum level, the selective switch 2 is switched to the first output terminal 2a, so that the maximum value of an attenuation ATT of the attenuator 1 is set to 0 dB. After that, the microcomputer 100 reduces a gain of the variable gain power amplifier 30 from the maximum value. As a result, the transmit power changes in accordance with the gain of the variable gain power amplifier 30.

When the gain of the variable gain power amplifier 30 reaches the minimum value, 0 dB, the selective switch 2 is switched to the second output terminal 2b, and the gain of the variable gain power amplifier 30 is kept to constant. In this situation, the microcomputer 100 controls so that the attenuation ATT of the attenuator 1 becomes large. As a result, the transmit power can be further reduced to the minimum level in accordance with the attenuation ATT of the attenuator 1.

On the contrary, while the selective switch 2 is switched to the second output terminal 2b, when the transmit power is increased from the minimum level, the microcomputer 100 controls so that the attenuation ATT of the attenuator 1 becomes small. When the attenuation ATT1 of the attenuator 1 reaches the minimum value, 0 dB, the selective switch 2 is switched to the first output terminal 2a, and the attenuation ATT of the attenuator 1 is kept to constant. In this situation, the microcomputer 100 controls so that the gain of the variable gain power amplifier 30 becomes large.

According to this structure, the transmit power can be continuously changed between the maximum level and the minimum level. Furthermore, since the microcomputer 100 moves to a gain control by using one of the attenuators 1 and the variable gain power amplifier 30, which has not been controlled until that time, with remaining the gain of another of the attenuators 1 and the variable gain power amplifier 30, the microcomputer 100 can prevent the overshoot or the undershoot of the transmit power.

Here, in the third embodiment, the power amplifier 3 as shown described in the second embodiment can be connected to the variable gain power amplifier 30 in series. In the first to the third embodiments, the attenuator 1 is used for exemplifying the variable gain circuit, which is provided at the former stage of the selective switch 2. However, a variable amplifier, which amplifies by a positive gain in accordance with a control as an input signal, or a variable amplifier, which amplifies by one of a positive and a negative gain. Furthermore, the transmit power control circuit 3 can be applied to the other radio communication apparatus than the portable telephone.

What is claimed is:

1. A transmit power control circuit comprising:
   a variable gain circuit for inputting a radio-frequency signal, for amplifying the radio-frequency signal with a gain which changing based on an external control signal, and for outputting an amplified radio-frequency signal as an output signal;
   a first switching circuit for selecting one of a main transmission line and an auxiliary transmission line, and for outputting the output signal of the variable gain circuit to the one of the main transmission line and the auxiliary transmission line;
   an amplifying circuit provided to the main transmission line, and for amplifying the output signal of the variable gain circuit, which being outputted to the main transmission line;
   a directional coupler coupled with the main transmission line with a predetermined amount of coupling, and having one end and another end;
   a second switching circuit for connecting the one end of the directional coupler to a first terminator when the output signal of the variable gain circuit is outputted to the main transmission line, and for connecting the one end of the directional coupler to the auxiliary transmission line when the output signal of the variable gain circuit is outputted to the auxiliary transmission line; and
   a third switching circuit for connecting said another end of the directional coupler to a wave detector when the output signal of the variable gain circuit is outputted to the main transmission line, and for connecting said another end of the directional coupler to a second terminator when the output signal of the variable gain circuit is outputted to the auxiliary transmission line.

2. The circuit according to claim 1, wherein the amplifying circuit includes an amplifier for amplifying by using a predetermined positive gain.

3. The circuit according to claim 2, further comprising a power shutdown circuit for shutting down off a power supply to the amplifier, when the first switching circuit switches the selection from the main transmission line to the auxiliary transmission line.

4. The circuit according to claim 1, wherein:
   the amplifying circuit includes an attenuator for amplifying the output signal of the variable gain circuit based on an another control signal, and
   an attenuation of the attenuator is controlled without changing a gain of the variable gain circuit when the output signal of the variable gain circuit is outputted to the main transmission line, and the attenuation of the variable gain circuit is controlled without changing the gain of the attenuator when the output signal of the variable gain circuit is outputted to the auxiliary transmission line.

5. The circuit according to claim 1, wherein:
   the amplifying circuit includes a variable gain power amplifier whose gain changes based on the external control signal,
   a gain of the variable gain power amplifier is controlled without changing a gain of the variable gain circuit when the output signal of the variable gain circuit is outputted to the main transmission line, and
   the gain of the variable gain circuit is controlled without changing the gain of the variable gain power amplifier when the output signal of the variable gain circuit is outputted to the auxiliary transmission line.

6. A transmit power control circuit comprising:
   a variable gain circuit for inputting a radio-frequency signal, for amplifying the radio-frequency signal with a gain which changing based on an external control signal, and for outputting an amplified radio-frequency signal as an output signal;
   a first switching circuit for selecting one of a main transmission line and an auxiliary transmission line, and for outputting the output signal of the variable gain circuit to the one of the main transmission line and the auxiliary transmission line;
   an amplifying circuit provided to the main transmission line, and for amplifying the output signal of the variable gain circuit, which being outputted to the main transmission line; and
   a directional coupler coupled with the main transmission line with a predetermined amount of coupling, and having one end and another end; and
   a second switching circuit for connecting the one end of the directional coupler to a first terminator when the output signal of the variable gain circuit is outputted to the main transmission line, and for connecting the one end of the directional coupler to the auxiliary transmission line when the output signal of the variable gain circuit is outputted to the auxiliary transmission line.

7. A transmit power control circuit comprising:
   a variable gain circuit for inputting a radio-frequency signal, for amplifying the radio-frequency signal with a gain which changing based on an external control signal, and for outputting an amplified radio-frequency signal as an output signal;
   a first switching circuit for selecting one of a main transmission line and an auxiliary transmission line, and for outputting the output signal of the variable gain circuit to the one of the main transmission line and the auxiliary transmission line;
   an amplifying circuit provided to the main transmission line, and for amplifying the output signal of the variable gain circuit, which being outputted to the main transmission line;
   a directional coupler coupled with the main transmission line with a predetermined amount of coupling, and having one end and another end; and
   a second switching circuit for connecting said another end of the directional coupler to a wave detector when the output signal of the variable gain circuit is outputted to the main transmission line, and for connecting said another end of the directional coupler to a second terminator when the output signal of the variable gain circuit is outputted to the auxiliary transmission line.

8. A transmit power control circuit comprising:

a variable gain circuit for inputting a radio-frequency signal, for amplifying the radio-frequency signal with a gain which changing based on an external control signal, and for outputting an amplified radio-frequency signal as an output signal;

a first switching circuit for selecting one of a main transmission line and an auxiliary transmission line, and for outputting the output signal of the variable gain circuit to the one of the main transmission line and the auxiliary transmission line;

an amplifying circuit provided to the main transmission line, and for amplifying the output signal of the variable gain circuit, which being outputted to the main transmission line; and a directional coupler coupled with the main transmission line with a predetermined amount of coupling, and having one end and another end, wherein the one end of the directional coupler is electrically connected to an auxiliary transmission line, and said another end of the directional coupler is electrically connected to a terminator.

* * * * *